United States Patent [19]

Sanderson et al.

[11] Patent Number: 5,099,194

[45] Date of Patent: Mar. 24, 1992

[54] DIGITAL FREQUENCY MEASUREMENT RECEIVER WITH BANDWIDTH IMPROVEMENT THROUGH MULTIPLE SAMPLING OF REAL SIGNALS

[75] Inventors: Richard B. Sanderson, Dayton; James B. Y. Tsui, Centerville, both of Ohio

[73] Assignee: The United States of America as represented by the Secretary of the Air Force, Washington, D.C.

[21] Appl. No.: 672,310

[22] Filed: Mar. 6, 1991

[51] Int. Cl.⁵ ............................................ G01R 23/00
[52] U.S. Cl. ........................... 324/78 D; 342/14; 342/16; 342/18; 342/20; 364/484; 324/79 D; 324/83 D; 324/77 B; 324/77 D
[58] Field of Search ................ 342/98, 14, 16, 17, 342/18, 20; 364/484; 324/77 B, 77 D, 78 D, 79 D, 83 Q, 83 D

[56] References Cited

U.S. PATENT DOCUMENTS

| | | | |
|---|---|---|---|
| 3,708,746 | 1/1973 | Willett et al. | 324/77 |
| 3,984,770 | 10/1976 | Chu | 364/484 |
| 4,336,541 | 6/1982 | Tsui et al. | 343/18 |
| 4,504,785 | 3/1985 | Tucker et al. | 324/77 |
| 4,633,516 | 12/1986 | Tsui | 455/226 |
| 4,893,266 | 1/1990 | Deem | 364/726 |
| 4,979,215 | 12/1990 | Fontanes | 364/484 |

Primary Examiner—Kenneth A. Wieder
Assistant Examiner—Jose M. Solis
Attorney, Agent, or Firm—Bernard E. Franz; Donald D. Singer

[57] ABSTRACT

This proposed approach to extending the frequency range uses non-uniform sampling to gain the advantages of a high sampling rate with only a modest increase in the number of samples. The basic idea is to use two sets of uniform samples with slightly different sampling frequency. Each set of samples is Fourier transformed independently and the frequency of the lowest aliases determined. It is shown that knowledge of these two alias frequencies permits unambiguous determination of the signal frequency over a range far exceeding the Nyquist frequency, except at a discrete set of points. It is further shown that one additional set of samples is sufficient to resolve all these discrete degeneracies.

3 Claims, 1 Drawing Sheet

DIGITAL FREQUENCY MEASUREMENT RECEIVER WITH BANDWIDTH IMPROVEMENT THROUGH MULTIPLE SAMPLING OF REAL SIGNALS

RIGHTS OF THE GOVERNMENT

The invention described herein may be manufactured and used by or for the Government of the United States for all governmental purposes without the payment of any royalty.

CROSS REFERENCE TO RELATED APPLICATIONS

This is one of three related applications by the same applicants and filed on Mar. 6, 1991: (1) Digital Frequency Measurement Receiver With Bandwidth Improvement Through Multiple Sampling of Complex Signals, Ser. No. 07/672,515 (2) Digital Frequency Measurement Receiver With Bandwidth Improvement Through Multiple Sampling of Real Signals, Ser. No. 07/672,310; and (3) Instantaneous Frequency Measurement Receiver With Bandwidth Improvement Through Phase Shifted Sampling Of Real Signals, Ser. No. 07/672,309.

BACKGROUND OF THE INVENTION

The present invention relates generally to a digital frequency measurement receiver with bandwidth improvement through multiple sampling of real signals.

In a digital rf receiver, the incident radiation is mixed with a local oscillator signal and down converted to an intermediate frequency (IF). This IF signal is discretely sampled and further processing is done using digital techniques. The frequency of the incident radiation may be determined by performing a discrete Fourier transform on the sampled signal. The range of frequencies that can be determined by such methods is limited by aliasing effects that limit the frequency range to $\frac{1}{2}b$, the Nyquist frequency, where b is the uniform sampling interval. In order to measure frequencies over a wide range, a very high sampling frequency must be used.

U.S. patents of interest include U.S. Pat. No. 4,336,541, to Tsui, which teaches an IFM receiver that detects the difference of two or more RF signals between the onset of the first RF signal pulse and the completion of the frequency encoding strobe. U.S. Pat. No. 4,504,785 to Tucker teaches a sampling spectrum analyzer wherein an input signal is split and each resulting portion is passed down a tapped delay line with samples being taken at each tap processed by separate arithmetic units. U.S. Pat. No. 4,633,516 to Tsui teaches an IFM receiver with an A/D converter which permits elimination of a phase correlator. U.S. Pat. No. 3,708,746 to Willet teaches a system for analyzing the frequency of an incident signal including a digital filter wherein the center frequency of the incident signal is varied by changing the sampling rate.

SUMMARY OF THE INVENTION

An objective of the invention is to improve the bandwidth of a digital rf receiver that measures the frequency of an incident signal.

This proposed approach to extending the frequency range uses non-uniform sampling to gain the advantages of a high sampling rate with only a modest increase in the number of samples. The basic idea is to use two sets of uniform samples with slightly different sampling frequency. Each set of samples is Fourier transformed independently and the frequency of the lowest aliases determined. It is shown that knowledge of these two alias frequencies permits unambiguous determination of the signal frequency over a range far exceeding the Nyquist frequency, except at a discrete set of points. It is further shown that one additional set of samples is sufficient to resolve all these discrete degeneracies.

DETAILED DESCRIPTION

Figure 1:
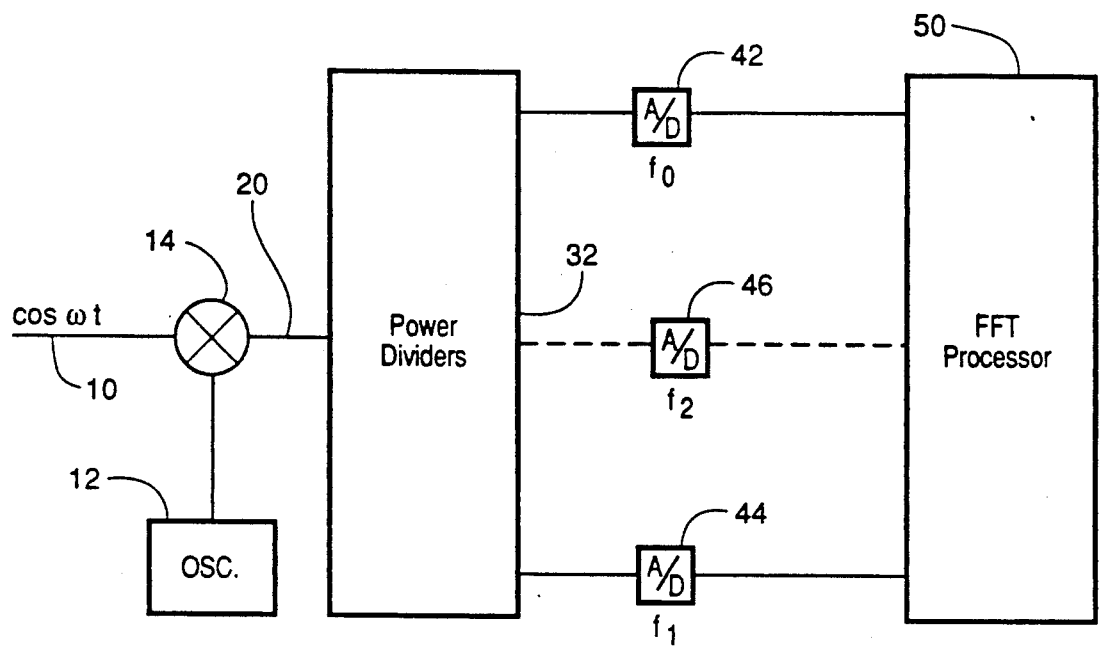
FIG. 1 is a functional block diagram showing an IFM receiver according to the invention.

This proposed approach to extending the frequency range uses non-uniform sampling to gain the advantages of a high sampling rate with only a modest increase in the number of samples. The basic idea is to use two sets of uniform samples with slightly different sampling frequency, as shown in FIG. 1. Each set of samples is Fourier transformed independently and the frequency of the lowest aliases determined. It is shown that knowledge of these two alias frequencies permits unambiguous determination of the signal frequency over a range far exceeding the Nyquist frequency, except at a discrete set of points. It is further shown that one additional set of samples is sufficient to resolve all these discrete degeneracies.

In FIG. 1, the incoming RF signal $\cos(2\pi ft)$ on line 10 is supplied to a mixer 14 for down conversion to the intermediate frequency (IF). The signal from a local oscillator 12 is applied to the mixer 14. The IF signal from mixer 14 is divided in a power divider apparatus 32 and supplied to two analog-to-digital converters 42 and 44. The converter 42 is operated at a sampling frequency $f_0$, and the converter 44 is operated at a sampling frequency $f_1$. The signals from the converters 42 and 44 are then supplied to a processor 50, which perform fast Fourier transforms to determine the frequency f.

Figure 2:
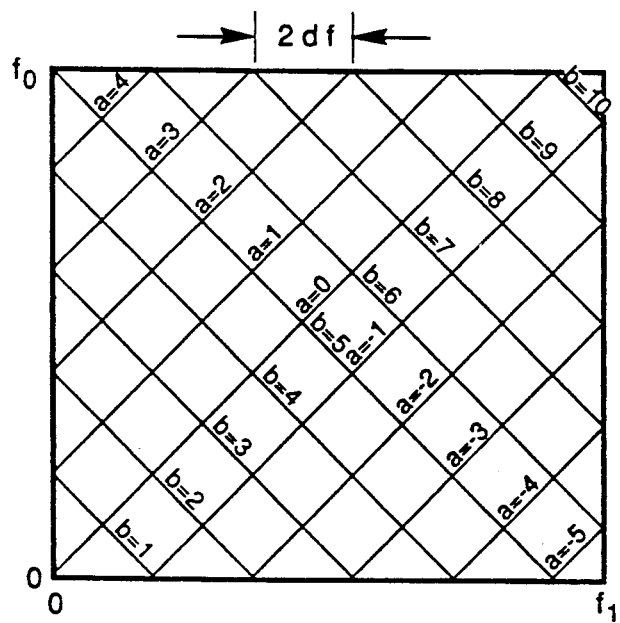
FIG. 2 is graph showing the effect of using two sets of samples of different frequency.

The effect of using two sets of samples of different frequency is illustrated in FIG. 2. The two Nyquist frequencies are $f_0$ and $f_1$ (assumed $> f_0$). The lowest alias for the $f_1$ sampling is plotted on the x axis and the lowest alias for the $f_0$ sampling is plotted on the y axis. The curve of possible values lies on the mesh formed by a 45 degree line starting at the origin and reflected at the boundaries $x=0,f_1$ and $y=0,f_0$ until the curve retraces itself. If, for convenience, $f_0$ and $f_1$ are chosen such that $f_0/(f_1-f_0)$ is integral, then retrace occurs at frequency, $f=f_0*f_1/(f_1-f_0)$. The line spacing is $2*(f_1-f_0)$. The frequency can be determined by calculating the parameters:

$$a=(y-x)/[2*(f_1-f_0)] \quad (1)$$

and $$b=(x+y)/[2*(f_1-f_0)] \quad (2)$$

At least one of these parameters must be an integer if the data point lies on the mesh and the measurement is thereby valid. If a is an integer, the data point lies on a mesh line of positive slope; if b is an integer, the data point lies on a mesh line of negative slope. If both are integral, the data point lies at the crossing in the mesh and the measurement is ambiguous. If the condition $f_0/(f_1-f_0)=n$, an integer, holds, then the frequencies associated with the a and b branches of the mesh are represented in closed form.

$$f_a = 2f_1 \cdot a + x\, sgn(a) \text{ if a integral} \quad (3)$$

$$f_b = 2f_1\, b - x \text{ if } b <= n/2 \text{ and b integral} \quad (4)$$

$$f_b = 2f_1(n-b) + x \text{ if } b > n/2 \text{ and b integral} \quad (5)$$

Using these expressions, a unique frequency can be determined except at the crossing points where a and b solutions exist.

It is not essential that the condition $f_0/(f_1-f_0)=n$ hold. In that case, the expression in equations 3–5 can be replaced by a look-up table that identifies the frequencies associated with each branch of the mesh.

The ambiguous solutions can be resolved by using a third set of uniformly spaced samples at a different Nyquist frequency, $f_2$ (provided by a third A/D converter 46 in FIG. 1). If we do a Fourier transform on this set and use the lowest alias in conjunction with that from either $f_0$ or $f_1$ in the analysis given above, all the discrete points of ambiguity can be resolved. Summary: Increasing the number of samples by a factor of three permits increasing the spectral range by factors of the order of ten or more. For example, if $f_0=100$ MHz, $f_1=110$ MHz and $f_2=105$ MHz, the spectral range is extended from 100 MHz to 1100 MHz. The increase is limited by the increasing fineness of the mesh which ultimately makes it impossible to distinguish on which branch the data point lies. The technique works because the combination of different sampling frequencies leaves at least some pairs of characterize the high frequency components.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver comprising:
    power dividing means coupling a source of signals to inputs of first and second analog-to-digital converters, the first analog-to-digital converter being operated at a first sampling frequency $f_0$ to provide a set of samples as a first signal, and the second analog-to-digital converter being operated at a second sampling frequency $f_1$ to provide a set of samples as a second signal, and processing means coupled to the outputs of the first and second analog-to-digital converters;
    wherein said processing means comprises means for performing discrete Fourier transforms independently on said first and second signals, a lowest alias for the $f_1$ sampling being used as an x value, and a lowest alias for the $f_0$ sampling being used as a y value, a lowest alias for the $f_1$ sampling is plotted on the x axis and a lowest alias for the $f_0$ sampling is plotted on the y axis, with a curve of possible values lying on the mesh formed by a 45 degree line starting at the origin and reflected at the boundaries $x=0, f_1$ and $y=0, f_0$ until the curve retraces itself, wherein $f_0$ and $f_1$ are chosen such that $f_0/(f_1-f_0)$ is integral, so that retrace occurs at frequency, $f = f_0 * f_1/(f_1-f_0)$, line spacing being $2*(f_1-f_0)$. the frequency f being determined by calculating the parameters:

$$a = (y-x)/[2*(f_1-f_0)] \quad (1)$$

and $$b = (x+y)/[2*(f_1-f_0)] \quad (2)$$

with at least one of these parameters being an integer if the data point lies on the mesh and the measurement is thereby valid, wherein if a is an integer, the data point lies on a mesh line of positive slope; if b is an integer, the data point lies on a mesh line of negative slope, and wherein if the condition $f_0/(f_1-f_0)=n$, an integer, holds, then the frequencies associated with the a and b branches of the mesh are represented in closed form by the equations $$f_a = 2f_1|a| + x\, sgn(a) \text{ if a integral} \quad (3)$$

$$f_b = 2f_1\, b - x \text{ if } b <= n/2 \text{ and b integral} \quad (4)$$

$$f_b = 2f_1(n-b) + x \text{ if } b > n/2 \text{ b integral} \quad (5)$$

and using these expressions to determine a unique frequency.

2. A frequency measurement receiver according to claim 1, further comprising a third analog-to-digital converter coupled between the power dividing means and the processor, operated at a third sampling frequency $f_2$ to provide a set of samples as a third signal,
    wherein said processor includes means for performing a Fourier transform on the third signal and means for using the lowest alias in conjunction with that from either frequency $f_0$ or $f_1$, as set forth in claim 1, to resolve all ambiguities at discrete points.

3. A frequency measurement receiver comprising:
    power dividing means coupling a source of signals to inputs of first and second analog-to-digital converters, the first analog-to-digital converter being operated at a first sampling frequency $f_0$ to provide a set of samples as a first signal, and the second analog-to-digital converter being operated at a second sampling frequency $f_1$ to provide a set of samples as a second signal, and processing means coupled to the outputs of the first and second analog-to-digital converters;
    wherein said processing means comprises means for performing discrete Fourier transforms independently on said first and second signals, a lowest alias for the $f_1$ sampling being used as an x value, and a lowest alias for the $f_0$ sampling being used as a y value, a lowest alias for the $f_1$ sampling is plotted on the x axis and a lowest alias for the $f_0$ sampling is plotted on the y axis, with a curve of possible values lying on the mesh formed by a 45 degree line starting at the origin and reflected at the boundaries $x=0, f_1$ and $y=0, f_0$ until the curve retraces itself, wherein $f_0$ and $f_1$ are chosen such that $f_0/(f_1-f_0)$ is integral, so that retrace occurs at frequency, $f = f_0 * f_1/(F_1-f_0)$, line spacing being $2*(f_1-f_0)$, the frequency f being determined by calculating the parameters:

$$a = (y-x)/[2*(f_1-f_0)] \quad (1)$$

and $$b = (x+y)/[2*(f_1-f_0)] \quad (2)$$

a look-up table that identifies the frequencies associated with each branch of the mesh function, and means using the look-up table for determining the frequency f.

* * * * *

UNITED STATES PATENT AND TRADEMARK OFFICE
CERTIFICATE OF CORRECTION

PATENT NO. : 5,099,194

DATED : March 24, 1992

INVENTOR(S) : Richard B. Sanderson et al

It is certified that error appears in the above-identified patent and that said Letters Patent is hereby corrected as shown below:

Column 3, line 32, --narrowly spaced sampling points which provide the information to-- should follow "pairs of".

Column 4, line 58, "$F_1$" should read --$f_1$--.

Signed and Sealed this

First Day of June, 1993

Attest:

MICHAEL K. KIRK

*Attesting Officer*   Acting Commissioner of Patents and Trademarks